(12) United States Patent
Butler et al.

(10) Patent No.: US 7,352,436 B2
(45) Date of Patent: Apr. 1, 2008

(54) LITHOGRAPHIC APPARATUS, PROJECTION APPARATUS AND DEVICE MANUFACTURING METHOD

(75) Inventors: Hans Butler, Best (NL); Evert Hendrik Jan Draaijer, Eindhoven (NL); Marcus Joseph Elisabeth Godfried Breukers, Eindhoven (NL)

(73) Assignee: ASML Netherlands, B.V., Veldhoven (NL)

( * ) Notice: Subject to any disclaimer, the term of this patent is extended or adjusted under 35 U.S.C. 154(b) by 332 days.

(21) Appl. No.: 11/155,883

(22) Filed: Jun. 20, 2005

(65) Prior Publication Data
US 2006/0285101 A1   Dec. 21, 2006

(51) Int. Cl.
G03B 27/32 (2006.01)
G03B 27/42 (2006.01)
G03B 27/58 (2006.01)

(52) U.S. Cl. ............................. 355/53; 355/72; 355/77
(58) Field of Classification Search .................. 355/53, 355/72, 75, 77
See application file for complete search history.

(56) References Cited
U.S. PATENT DOCUMENTS 5,184,055 A * 2/1993 Ohishi et al. ............... 318/615
5,696,590 A * 12/1997 Makita ........................ 356/399
7,098,990 B2 * 8/2006 Butler ........................... 355/53
2002/0140921 A1 * 10/2002 Morisada ...................... 355/73

* cited by examiner

Primary Examiner—Rodney Fuller
(74) Attorney, Agent, or Firm—Pillsbury Winthrop Shaw Pittman LLP

(57) ABSTRACT

A control system to control a position of a substrate table for a lithographic apparatus, including: a first detection device to generate a position signal representative of the position of the projection system, a second detection device to generate a projection system feed-forward signal, a comparative unit to generate a servo error signal by subtracting a signal representative of an actual substrate table position from a substrate table position reference signal and adding the projection system position signal, a control unit to generate a first control signal on the basis of the servo error signal, an addition unit to generate a second control signal by adding the feed-forward signal and the first control signal, and an actuator unit to actuate the substrate table to a desired substrate table position on the basis of the second control signal. The control system further includes a projection system position signal filter unit.

18 Claims, 5 Drawing Sheets

LITHOGRAPHIC APPARATUS, PROJECTION APPARATUS AND DEVICE MANUFACTURING METHOD

BACKGROUND

1. Field of the Invention

The present invention relates to a lithographic apparatus, a projection apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus comprises a control system to control the position of the substrate table. This control system is not only configured to place the substrate table in a desired position on the basis of a reference signal, but also to follow the lens in a horizontal direction in order to minimize image errors caused by movements of the lens, which movement are for instance caused by vibrations in the lithographic apparatus. For this reason a projection system position signal is added to the substrate table position reference signal, so that the controller error is adapted for movements of the lens. Usually the projection system position signal is obtained by a interferometer measuring system. To further increase the accuracy in following the movements of the lens, the control system comprises a feed-forward branch which adds a feed-forward signal representative for the acceleration of the lens to a output signal of the controller unit of the control system. The feed-forward signal is obtained by accelerometers arranged on the lens. The feed-forward signal is conditioned by a feed-forward filter unit. This feed-forward filter unit may comprise analogue filtering of the feed-forward signal and may also comprise digital filters to shape the feed-forward correctly.

A disadvantage of the known control system is that the filtering of the feed-forward signal introduces phase lag/delay in the feed-forward branch, which results in that the actual position of the substrate table lags behind the actual position of the lens, and hence creating a servo error/lens tracking error. This servo error/lens tracking error may be countered by adding lead-lag filters in the feed-forward branch, which introduce a phase advantage at the dominant lens resonance frequencies. However, this is only possible for a limited number of frequencies and as a consequence the response becomes worse at other frequencies. For this reason, the performance that can be gained with this strategy reaches its limits when the number of lens resonance frequencies increases and/or the position accuracy requirements become higher. Furthermore, the lead-lag filters are highly lens dependent, and therefore often have to be tuned by hand, which increases the risk on a poor response on the movements of the lens.

SUMMARY

It is desirable to provide a control system which is configured to further reduce the effect of movements of the projection system on the servo error and/or the projection system tracking error.

According to an embodiment of the invention there is provided a lithographic apparatus comprising a projection system configured to project a patterned radiation beam onto a target portion of the substrate, the substrate being supported on a substrate table, wherein the lithographic apparatus comprises a control system configured to control a position of the substrate table, the control system comprising a first detection device configured to generate a projection system position signal representative for the position of the projection system, a second detection device configured to generate a projection system feed-forward signal, a comparative unit configured to generate a servo error signal by subtracting a signal representative for an actual substrate table position from a substrate table position reference signal and adding the projection system position signal, a control unit configured to generate a first control signal on the basis of the servo error signal, an addition unit configured to generate a second control signal by adding the projection system feed-forward signal and the first control signal, and an actuator unit configured to actuate the substrate table to a desired substrate table position on the basis of the second control signal, wherein the control system further comprises a projection system position signal filter unit configured to filter the projection system position signal before adding the projection system position signal to the reference substrate table position signal.

According to an embodiment of the invention there is provided a lithographic apparatus comprising:

a projection system configured to project a patterned radiation beam, the patterned radiation beam being imparted by a patterning device being supported on a patterning device support, wherein the lithographic apparatus comprises a control system configured to control a position of the patterning device support, the control system comprising a first detection device configured to generate a projection system position signal representative for the position of the projection system, a second detection device configured to generate a projection system feed-forward signal, a comparative unit configured to generate a servo error signal by subtracting a signal representative for an actual patterning device support position from a patterning device support position reference signal and adding the projection system position signal, a control unit configured to generate a first control signal on the basis of said servo error signal, an addition unit configured to generate a second control signal by adding the projection system feed-forward signal and the first control signal, and an actuator unit configured to actuate the patterning device support to a desired patterning device support position on the basis of the second control signal, wherein the control system further comprises a projection system position signal filter unit configured to filter the projection system position signal before adding the projection system position signal to the reference patterning device support position signal.

According to an embodiment of the invention there is provided a projection apparatus comprising a control system configured to control a position of a first component, on the basis of a first component reference signal and a position of a second component, the control system comprising:

a first detection device configured to generate a second component position signal representative for the position of the second component, a second detection device configured to generate a second component feed-forward signal, a comparative unit configured to generate a servo error signal by subtracting a signal representative for an actual first component position from a first component position reference signal and adding the second component position signal, a control unit configured to generate a first control signal on the basis of the servo error signal, an addition unit configured to generate a second control signal by adding the second component feed-forward signal and the first control signal, and an actuator unit configured to actuate the first component to a desired first component position on the basis of the second control signal, wherein the control system further comprises a second component position signal filter unit configured to filter the second component position signal before adding the second component position signal to the reference first component position signal.

According to an embodiment of the invention there is provided a device manufacturing method comprising using a projection system for projecting a patterned beam of radiation onto a substrate, the substrate being supported on a substrate table, wherein a control system configured to control the position of the substrate table is used, wherein a projection system position signal representative for a position of the projection system is added to the difference between a substrate table position reference signal and an actual substrate table position resulting in a servo error signal which is used as an input for a control unit, wherein in a feed-forward branch a projection system feed-forward signal is added to a first control signal of the control unit resulting in a second control signal, wherein the second control signal is used to actuate the substrate table to a desired substrate table position, and wherein the projection system position signal is filtered by a projection system position signal filter unit before being added to the difference between said substrate table position reference signal and said actual substrate table position.

According to an embodiment of the invention there is provided a device manufacturing method comprising using a projection system for projecting a patterned beam of radiation, the pattern being imparted by a patterning device, the patterning device being supported on a patterning device support, wherein a control system configured to control the position of the patterning device support is used, wherein a projection system position signal representative for a position of the projection system is added to the difference between a patterning device support position reference signal and an actual patterning device support position resulting in a servo error signal which is used as an input for a control unit, wherein in a feed-forward branch a projection system feed-forward signal is added to a first control signal of the control unit resulting in a second control signal, wherein the second control signal is used to actuate the patterning device support to a desired patterning device support position, and wherein the projection system position signal is filtered by a projection system position signal filter unit before being added to the difference between the patterning device support position reference signal and the actual patterning device support position.

According to an embodiment of the invention there is provided a device manufacturing method comprising using a projection apparatus, wherein a control system is used, the control system being configured to control a position of a first component on the basis of a first component reference signal and a position of a second component, wherein a second component position signal representative for a position of the second component is added to the difference between a first component position reference signal and an actual first component position resulting in a servo error signal which is used as an input for a control unit, wherein in a feed-forward branch a projection system feed-forward signal is added to a first control signal of the control unit resulting in a second control signal, wherein the second control signal is used to actuate the first component to a desired first component position, and wherein the second component position signal is filtered by a second component position signal filter unit before being added to the difference between said first component position reference signal and the actual first component position.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
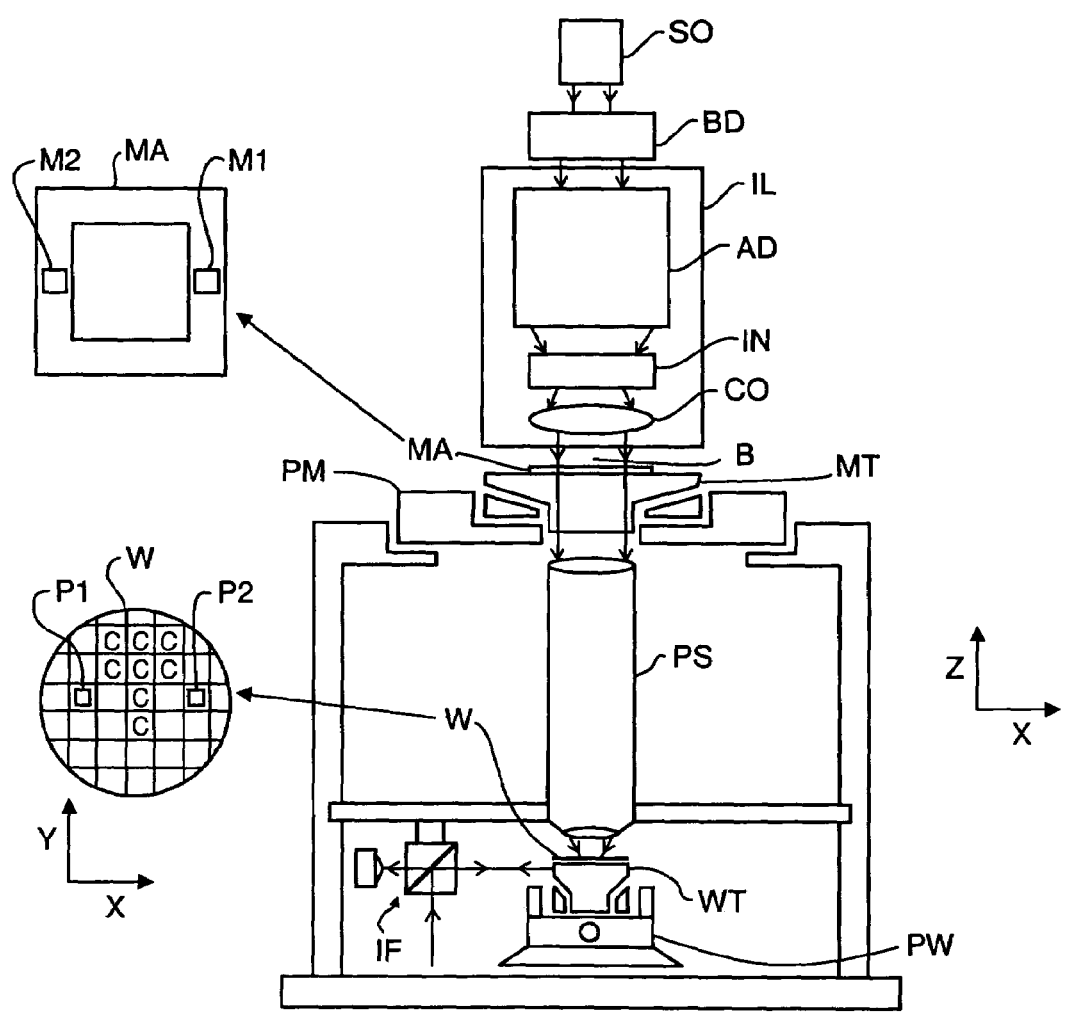
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" and "lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
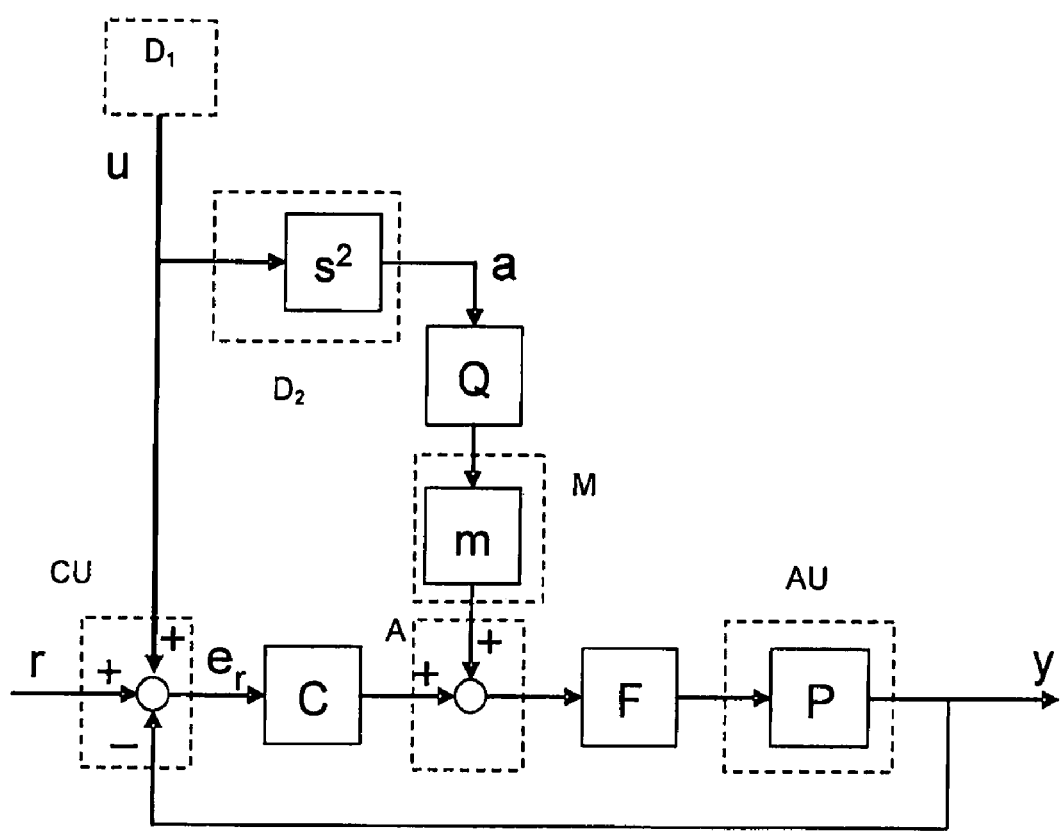
FIG. 2 depicts a conventional control scheme of a control system.

In FIG. 2 a control scheme for controlling the position of the substrate table in a horizontal direction according to the prior art is shown. The control scheme comprises a control unit C, a filter unit F and the substrate table having a transfer function P. The actual position y of the substrate table is in a comparative unit CU subtracted from a substrate table position reference signal r, resulting in a servo error $e_r$, which is used as an input for the control unit C. When the substrate table position reference signal is changed the control unit C will actuate the substrate table by an actuator unit AU to move to the desired position, wherein the actual substrate table position equals the substrate table position reference signal resulting in a zero servo error. It is remarked that the control scheme may further comprise several elements which are not directly related to the present invention, such as for instance reference signal acceleration feed-forward. Such elements are not shown in the control scheme of FIG. 2.

The filter F may be used to condition the control signal and may for instance comprise a notch filter which dampens the response of the substrate table at the resonance frequencies of the substrate table. Any other suitable filter-type for filtering the control signal may be applied.

Due to vibrations or other movements in the lithographic apparatus, the projection system, or a part thereof may move, which movement may have a negative influence on the image that is projected by the lithographic apparatus on the substrate, thus resulting in imaging errors. Therefore, it is desirable that the substrate table reacts to movements of the projection system, for instance a lens (lens column), in order to avoid or at least reduce these imaging errors caused by the movements of the lens.

In order to make the substrate table follow movements of the, a signal u representative for the actual position of the lens is in the comparative unit added to the difference between the substrate table position reference signal and the actual substrate table position. The signal u may be obtained by a first detection device $D_1$, such as an interferometer measurement system.

To further improve the reaction of the substrate table on movements of the lens, a feed-forward branch is introduced into the control scheme. In this feed-forward branch a feed-forward signal a representative for the acceleration of the lens is multiplied by m, m representing the mass of the substrate table by a multiplier M and consequently added to the output signal of the control unit C by an addition unit A. Before multiplying with the mass m of the substrate table, the feed-forward signal is filtered by feed-forward filter Q. In an alternative embodiment the order of the feed-forward filter Q and the mass multiplier m may be swapped.

In this application a signal representative for the acceleration of the lens may also be a acceleration signal already multiplied with m, being approximately the mass of the substrate table including a substrate supported thereon, since that signal is still. For instance the signal produced by the accelerometer may already be a signal in which the mass of the substrate table has been accounted for. The signal may also later in the feed-forward branch be multiplied with m, as shown in FIG. 2.

The acceleration signal a may be obtained by a second detection device $D_2$, such as an accelerometer, but this second detection device $D_2$ may also be the same as the first detection device $D_1$, whereby the latter case the acceleration of the projection system is obtained by differentiating the position signal u. This second embodiment is shown in the control scheme of FIG. 2, wherein u is multiplied by $s^2$ to obtain the accelerationsignal a. In practice, it is preferred to use separate accelerometers to obtain the acceleration signal a.

The feed-forward filter Q may comprise the analogue filtering of the accelerometer signal and may also comprise possible digital filters configured to shape the feed-forward signal. The analogue filters of the feed-forward filter Q and the F filter may introduce phase lag into the feed-forward branch (from a to y). Also in a digital system some delay may be present due to e.g., the DAC's that perform a zero order hold function, a calculation delay and such. Therefore, y will lag behind u which will create a servo error $e_r$.

The digital filters in feed-forward filter unit Q may comprise lead-lag filters which introduce a phase advantage at the dominant lens resonance frequencies, to compensate for phase lag/delay in the feed-forward branch. However, this is only possible for a limited number of frequencies and as a consequence the response becomes worse at other frequencies. For this reason, the performance that can be gained with this strategy reaches its limits when the number of lens resonance frequencies increases and/or the position accuracy requirements become higher. Furthermore, the lead-lag filters are highly lens dependent, and therefore often have to be tuned by hand, which increases the risk on a poor response on the movements of the lens. There is a need for other solutions to decrease the servo error and/or the lens tracking error, i.e., the difference between the actual position of the projection system and the actual position of the substrate table.

Figure 3:
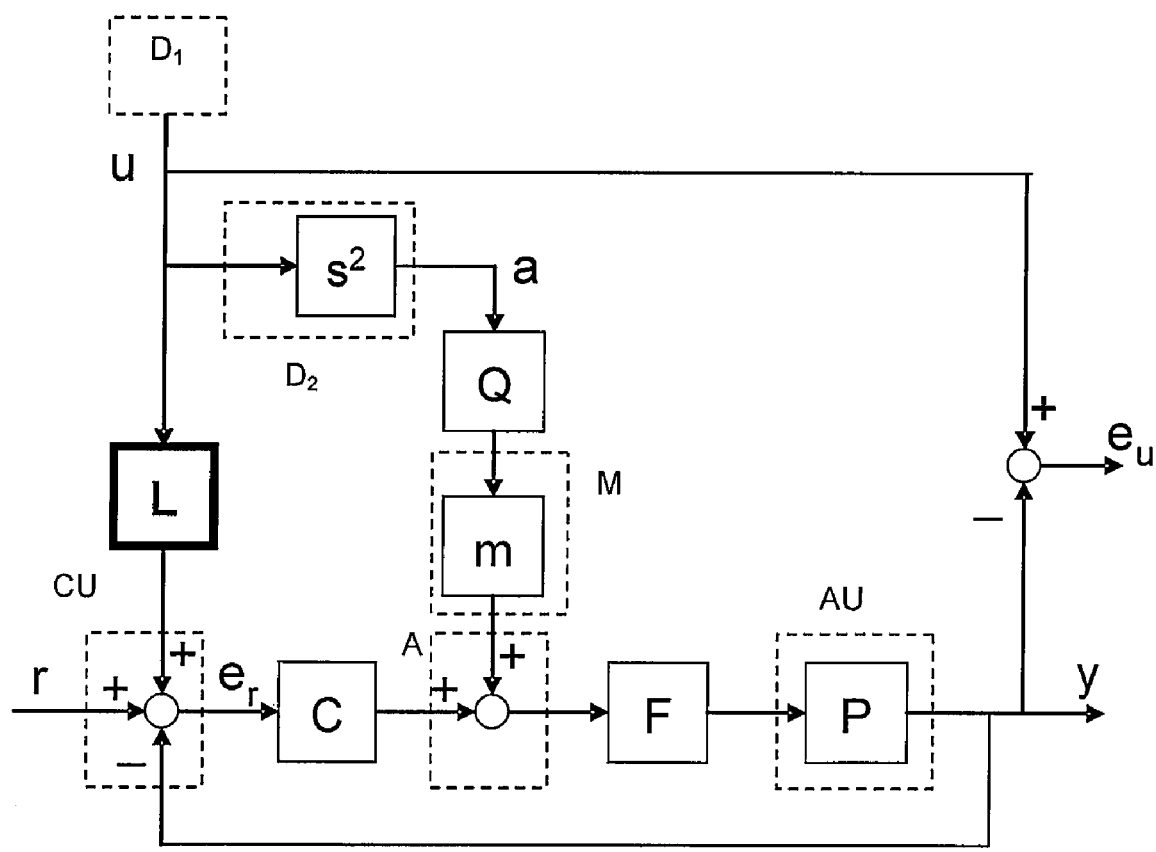
FIG. 3 depicts a control scheme of a control system according an embodiment of the invention.

In FIG. 3 a control scheme of a control system according to an embodiment of the invention is shown. The control scheme includes a filter L, which is configured to filter the projection system position signal before it is added at the comparative unit. Further, in the control scheme the lens tracking error (projection system tracking error) $e_u$ is shown, i.e., the difference between the (change in) position of the lens u and the (change in the) actual position of the substrate table y. This lens tracking error $e_u$ may be used to provide an indication of the imaging error that may be obtained when projecting an image on the substrate by a misalignment between substrate table and the projection system. The comparison between u and y in the control scheme is in practice not actually a physical part of the control scheme, but is here shown to indicate the lens tracking error $e_u$.

By adding a filter L to filter the projection system position signal u before feeding it to the comparative unit it is possible to further improve the response of the substrate table to a change in the position of the lens as will be explained hereinafter.

Two possible selection criteria for the selection of the transfer function of the filter L are here proposed. Other selection criteria may also be possible and are deemed to fall within the scope of the present invention.

In a first embodiment the filter L is selected to minimize the servo error $e_r$. To minimize this servo error $e_r$, L is chosen to be equal to the feed-forward path from u to y in the control scheme, i.e.,

L=QF

Hereby it is assumed that the process transfer function P does not contain any dynamics that make it deviate from $1/ms^2$. If P would contain such dynamics, these dynamics should also be included in the transfer function of filter L.

The filter L=QF can easily be implemented because the filter consists of two filters which are "proper," i.e., have a pole excess. Filter L selected according the first embodiment will hereinafter be indicated as L1.

In a second embodiment the filter L is selected to minimize the lens tracking error $e_u$, i.e., the difference between the (change in) position of the lens and the actual position of the substrate table y is miminized. To minimize $e_u$, first the overall transfer function from u to y is calculated.

$$\frac{y}{u} = \frac{(s^2 Qm + LC)FP}{1 + CFP}$$

If this transfer function equals 1, $e_u$ will be zero. Now, by setting y/u=1, L2 can be calculated to be:

$$L = 1 + \frac{(1 - s^2 mQFP)}{CFP}$$

Also here it is assumed that the process transfer function P does not contain any dynamics that make it deviate from $1/ms^2$. If P would contain such dynamics, these dynamics should also be included in the transfer function of filter L.

This choice for L is less easy to implement as the filter L now has a zero excess of 3, mainly due to the term $s^2$ in the numerator and the product CFP in denominator. To make this choice of L implementable a low-pass filter of the order 3 is included in L. In the example the low-pass cut-off frequency is set at 10000 Hz. A lower value may probably also be applied in practice. Filter L selected according to the second embodiment of the invention will hereinafter be indicated as L2.

The effects of the application of the filter units L1 and L2 according to the first and second embodiment of the invention will now be compared with the control scheme according to the prior art without a filter L in an example.

In this example the filter F is a notch filter at 150 Hz, the control unit C is a PID plus low-pass controller at a bandwidth of 100 Hz. Q is a low-pass filter with a cut-off frequency of 500 Hz. The transfer function of the process P is $1/ms^2$ as was indicated above. The mass m equals 10 kg.

Figure 4:
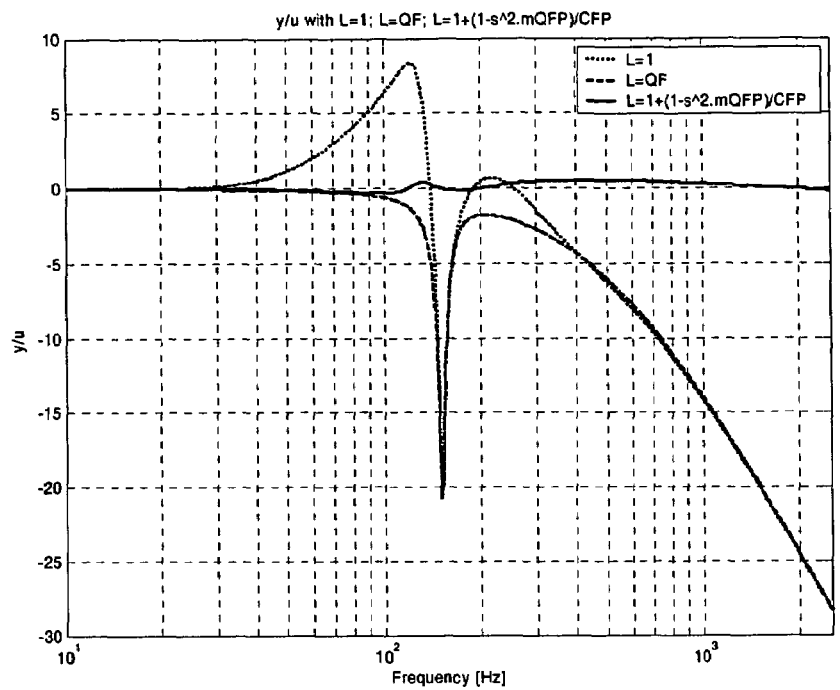
FIG. 4 shows the transfer functions y/u according to the prior art and two preferred embodiments of the invention.

FIG. 4 shows the effect of the usage of L1 and L2 on the transfer function y/u (i.e., reaction of the substrate table on lens movements), respectively. The vertical axis shows y/u in [dB]. It can be seen that without filtering (L=1), y/u can reach a gain of +8 dB, which means that the substrate table over-reacts with a factor of 2.5. On the other hand, when using a filter L1, y/u never shows a response larger than 0 dB. For higher frequencies, both curves follow the low-pass filtering characteristics in Q, because for these frequencies the open-loop gain is small. When using L2, y/u is substantially equal to 0 dB, indicating that y is almost equal to u for all frequencies.

Figure 5:
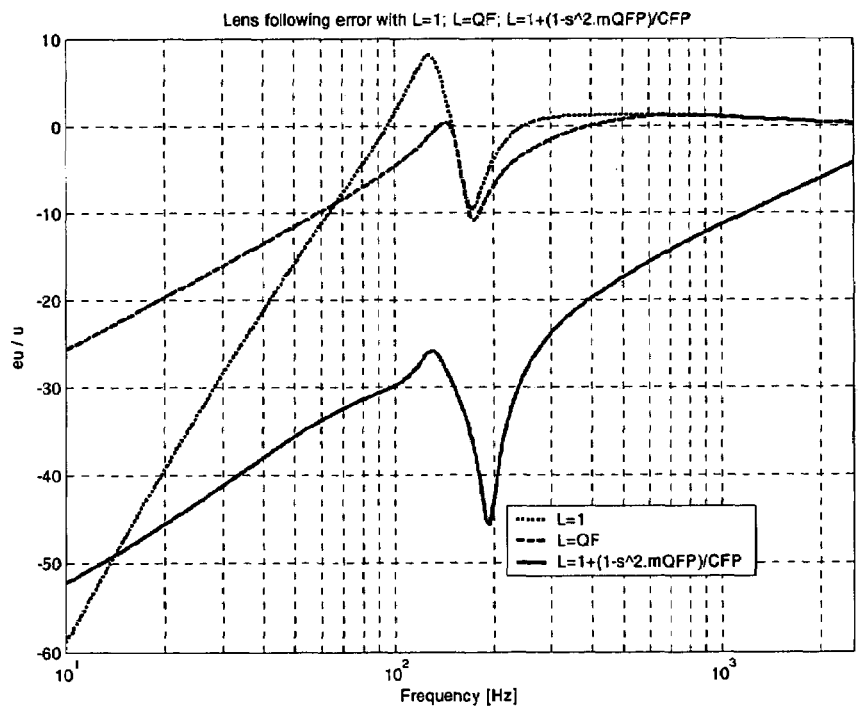
FIG. 5 shows the transfer functions $e_s/u$ according to the prior art and two preferred embodiments of the invention.

FIG. 5 shows the transfer function of $e_u/u$ (also in [dB]), i.e., how well the substrate table actually follows the lens for a specific frequency. A smaller value in this case is better, because it indicates a smaller difference between the lens position and the substrate table position. It can be seen that for low frequencies, the use of L1 deteriorates performance compared to when no filter unit L is used, as the magnitude of the transfer function is larger. From around 65 Hz, use of L1 improves the behavior compared to no filter unit L. Lens frequencies typically start around 90 Hz, so the net effect will still be positive. When using L2, the overall transfer function is much smaller, indicating a generally smaller $e_u$.

Figure 6:
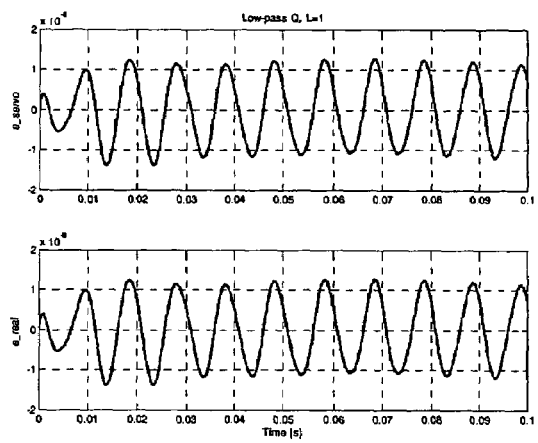
FIG. 6 shows the time response of the servo error and the lens tracking error on a lens movement for the system according to the prior art.
Figure 7:
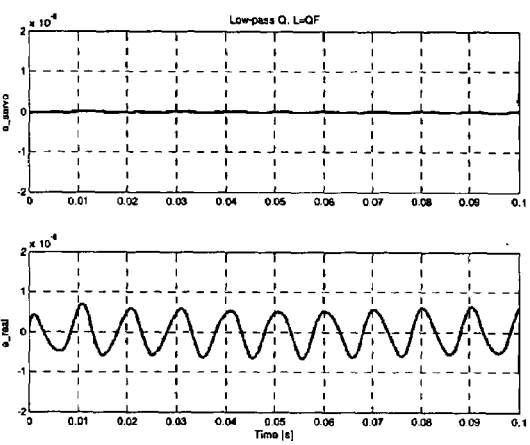
FIG. 7 shows the time response of the servo error and the lens tracking error on a lens movement for the system according to a first preferred embodiment of the invention.
Figure 8:
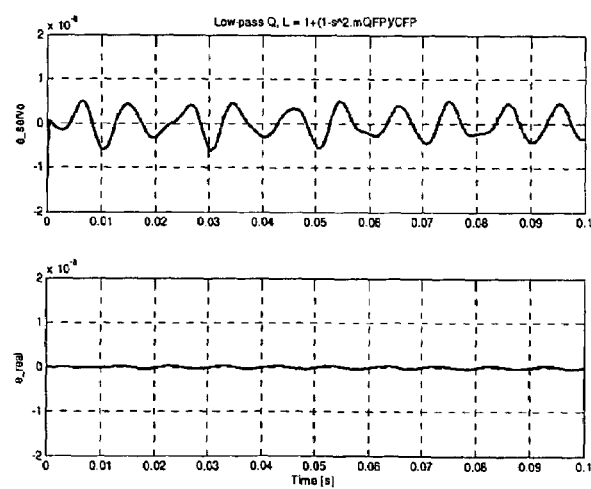
FIG. 8 shows the time response of the servo error and the lens tracking error on a lens movement for the system according to a second preferred embodiment of the invention.

FIGS. 6, 7 and 8 show the time response of the system with no filter unit L, with filter L1 and with filter L2, respectively, for a lens movement of 100 and 190 Hz with respective amplitudes of 10 and 2 nm. In each of FIGS. 6, 7 and 8, the top window shows the servo error $e_r$, and the bottom window shows the lens tracking error $e_u$.

FIG. 6 shows that without a filter unit L, the substrate table error with respect to the lens (i.e., $e_u$, bottom window) is about 12 nm, which matches the gain of the dotted line in FIG. 5 at 100 Hz. It is also clear that the servo error $e_r$ and the lens tracking error $e_u$ are the same.

As can be seen in FIG. 7 the servo error $e_r$ reduces to zero, as expected, when using a filter unit with filter L1. The lens tracking error reduces to about 6 nm, which matches the dashed line in FIG. 5 at 100 Hz, as a gain of −6 dB corresponds to a decrease by a factor ½.

FIG. 8 shows the result when a filter unit L2 is used. Now, the lens tracking error $e_u$ is close to zero, while the servo error $e_r$ has become approximately 6 nm.

From the results of the example it can be concluded that using a filter L for filtering the projection system position signal, may reduce both the servo error and the lens tracking error substantially. The choice of L determines which error is reduced the most. When selecting a filter L, L may for example be chosen to minimize the servo error, to minimize the lens tracking error, to minimize both servo error and lens tracking, for example the (weighted) sum of servo error lens tracking error, or any other suitable optimization criterium.

In the example two possible choices for the selection of L, namely L1 and L2 have been shown. L1 and L2 were selected to minimize servo error $e_r$ and lens tracking error $e_u$, respectively. The use of L1 and L2 also had a positive reducing effect on $e_u$ and $e_r$, respectively. Other design methods for selecting a transfer function of the filter unit L may be used depending on the system requirements. In this respect it is remarked that the transfer $e_r/u$ and/or $e_u/u$ only needs to approach zero for those frequencies that are actually present in the lens movements u. In the example presented here, this lens frequency spectrum was not yet taken into account. However, this lens frequency spectrum may be taken into account when an actual filter L is selected.

The use of a filter L according to embodiments of the invention is in particular suitable for providing a horizontal reaction movement of the substrate table in response to a horizontal movement of the projection system, such as the lens, in the same direction. However, the control scheme may also be used to make a substrate table response to a vertical movement of the projection system.

The control scheme comprising the filter L may also be used for optimizing the feed-forward of any other signal which is used in a lithographic apparatus. In particular the control scheme may be useful to make the response of a patterning device support on a change in a position of the projection system more accurately. Furthermore, the control scheme may particular successfully be applied in reducing the servo error and/or tracking error of a system, wherein it is desirable that a first component of a lithographic apparatus or more general a projection apparatus substantially follows, or corrects for, the movements (change of position) of a second component of the lithographic apparatus. For instance, the control scheme may also be used to control the position of the substrate table, wherein the control system is configured to react on movements of the patterning device support.

In view of the above, the features of the invention described in this application with respect to the control system for controlling the position of the substrate table may also be applied for controlling the position of a patterning device support, or in general the position of the first component.

Although specific reference may be made in this text to the use of lithographic apparatus in the manufacture of Ics, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
a projection system configured to project a patterned radiation beam onto a target portion of the substrate, said substrate being supported on a substrate table,
wherein said lithographic apparatus comprises a control system configured to control a position of said substrate table, said control system comprising:
a first detection device configured to generate a projection system position signal representative of a position of the projection system,
a second detection device configured to generate a projection system feed-forward signal,
a comparative unit configured to generate a servo error signal by subtracting a signal representative of an actual substrate table position from a substrate table position reference signal and adding said projection system position signal,
a control unit configured to generate a first control signal on the basis of said servo error signal,
an addition unit configured to generate a second control signal by adding said projection system feed-forward signal and said first control signal, and
an actuator unit configured to actuate said substrate table to a desired substrate table position on the basis of said second control signal,
wherein said control system further comprises a projection system position signal filter unit configured to filter said projection system position signal before adding said projection system position signal to the reference substrate table position signal.

2. A lithographic apparatus as claimed in claim 1, wherein said projection system position signal filter unit is configured to minimize said servo error signal and/or to minimize a projection system tracking error.

3. A lithographic apparatus as claimed in claim 1, wherein said control system comprises a feed-forward filter unit configured to condition said feed-forward signal, and wherein a transfer function of said projection system position signal filter unit at least partly comprises a transfer function of said feed-forward filter unit.

4. A lithographic apparatus as claimed in claim 1, wherein said control system comprises a control signal filter unit configured to filter said second control signal, and wherein a transfer function of said projection system position signal filter unit at least partly comprises a transfer function of said control signal filter unit.

5. A lithographic apparatus as claimed in claim 1, wherein any system dynamics which deviates from a transfer function $1/ms^2$ is substantially comprised in a transfer function of said projection system position signal filter unit.

6. A lithographic apparatus as claimed in claim 1, wherein said projection system feed-forward signal is representative of an acceleration of said projection system.

7. A lithographic apparatus as claimed in claim 6, wherein said control system comprises a multiplier unit configured to multiply said projection system feed-forward signal with approximately a mass of said substrate table before being fed to said addition unit.

8. A lithographic apparatus comprising:
a projection system configured to project a patterned radiation beam, said patterned radiation beam being imparted by a patterning device being supported on a patterning device support,
wherein said lithographic apparatus comprises a control system configured to control a position of said patterning device support, said control system comprising:
a first detection device configured to generate a projection system position signal representative of a position of the projection system,
a second detection device configured to generate a projection system feed-forward signal,
a comparative unit configured to generate a servo error signal by subtracting a signal representative of an actual patterning device support position from a patterning device support position reference signal and adding the projection system position signal,
a control unit configured to generate a first control signal on the basis of said servo error signal,
an addition unit configured to generate a second control signal by adding said projection system feed-forward signal and said first control signal, and
an actuator unit configured to actuate said patterning device support to a desired patterning device support position on the basis of said second control signal,
wherein said control system further comprises a projection system position signal filter unit configured to filter said projection system position signal before adding said projection system position signal to the reference patterning device support position signal.

9. A projection apparatus comprising a control system configured to control a position of a first component, on the basis of a first component reference signal and a position of a second component, said control system comprising:
a first detection device configured to generate a second component position signal representative of the position of the second component,
a second detection device configured to generate a second component feed-forward signal,
a comparative unit configured to generate a servo error signal by subtracting a signal representative for an actual first component position from a first component position reference signal and adding the second component position signal,
a control unit configured to generate a first control signal on the basis of said servo error signal,
an addition unit configured to generate a second control signal by adding said second component feed-forward signal and said first control signal, and
an actuator unit configured to actuate said first component to a desired first component position on the basis of said second control signal,
wherein said control system further comprises a second component position signal filter unit configured to filter said second component position signal before adding said second component position signal to the reference first component position signal.

10. A device manufacturing method comprising using a projection system for projecting a patterned beam of radiation onto a substrate, said substrate being supported on a substrate table, wherein a control system configured to control the position of said substrate table is used,
wherein a projection system position signal representative for a position of said projection system is added to the difference between a substrate table position reference signal and an actual substrate table position resulting in a servo error signal which is used as an input for a control unit, wherein in a feed-forward branch a projection system feed-forward signal is added to a first control signal of said control unit resulting in a second control signal, wherein said second control signal is used to actuate the substrate table to a desired substrate table position, and
wherein said projection system position signal is filtered by a projection system position signal filter unit before being added to said difference between said substrate table position reference signal and said actual substrate table position.

11. A method as claimed in claim 10, wherein said projection system position signal filter unit is configured to minimize said servo error signal and/or to minimize a projection system tracking error.

12. A method as claimed in claim 10, wherein said control system comprises a feed-forward filter unit configured to condition said projection system feed-forward signal, and wherein a transfer function of said projection system position signal filter unit at least partly comprises a transfer function of said feed-forward filter unit.

13. A method as claimed in claim 10, wherein said control system comprises a control signal filter unit configured to filter said second control signal, and wherein a transfer function of said projection system position signal filter unit at least partly substantially corresponds to a transfer function of said control signal filter unit.

14. A method as claimed in claim 10, wherein any system dynamics which deviates from a transfer function $1/ms^2$ is substantially comprised in a transfer function of said projection system position signal filter unit.

15. A method as claimed in claim 10, wherein said projection system feed-forward signal is representative of an acceleration of said projection system.

16. A method as claimed in claim 15, wherein said projection system feed-forward signal is multiplied with substantially the mass of said substrate table before being added to said control signal of said control unit.

17. A device manufacturing method comprising using a projection system for projecting a patterned beam of radiation, said pattern being imparted by a patterning device, said patterning device being supported on a patterning device support, wherein a control system configured to control the position of said patterning device support is used, wherein a projection system position signal representative for a position of said projection system is added to the difference between a patterning device support position reference signal and an actual patterning device support position resulting in a servo error signal which is used as an input for a control unit, wherein in a feed-forward branch a projection system feed-forward signal is added to a first control signal of said control unit resulting in a second control signal, wherein said second control signal is used to actuate said patterning device support to a desired patterning device support position, and wherein said projection system position signal is filtered by a projection system position signal filter unit before being added to said difference between said patterning device support position reference signal and said actual patterning device support position.

18. A device manufacturing method comprising using a projection apparatus:

wherein a control system is used, said control system being configured to control a position of a first component on the basis of a first component reference signal and a position of a second component, wherein a second component position signal representative for a position of said second component is added to the difference between a first component position reference signal and an actual first component position resulting in a servo error signal which is used as an input for a control unit, wherein in a feed-forward branch a projection system feed-forward signal is added to a first control signal of said control unit resulting in a second control signal, wherein said second control signal is used to actuate said first component to a desired first component position, and wherein said second component position signal is filtered by a second component position signal filter unit before being added to said difference between said first component position reference signal and said actual first component position.

* * * * *